(12) United States Patent
Cruz-Albrecht et al.

(10) Patent No.: US 11,694,070 B2
(45) Date of Patent: Jul. 4, 2023

(54) BIPOLAR ALL-MEMRISTOR CIRCUIT FOR IN-MEMORY COMPUTING

(71) Applicant: HRL Laboratories, LLC, Malibu, CA (US)

(72) Inventors: Jose Cruz-Albrecht, Oak Park, CA (US); Wei Yi, Moorpark, CA (US)

(73) Assignee: HRL LABORATORIES, LLC, Malibu, CA (US)

(*) Notice: Subject to any disclaimer, the term of this patent is extended or adjusted under 35 U.S.C. 154(b) by 374 days.

(21) Appl. No.: 16/808,227

(22) Filed: Mar. 3, 2020

(65) Prior Publication Data

US 2020/0356344 A1 Nov. 12, 2020

Related U.S. Application Data

(60) Provisional application No. 62/860,915, filed on Jun. 13, 2019, provisional application No. 62/844,611, filed on May 7, 2019.

(51) Int. Cl.
*G06N 3/065* (2023.01)
*G06F 17/16* (2006.01)
(Continued)

(52) U.S. Cl.
CPC ........... *G06N 3/065* (2023.01); *G06F 7/5443* (2013.01); *G06F 17/15* (2013.01); *G06F 17/16* (2013.01);
(Continued)

(58) Field of Classification Search
None
See application file for complete search history.

(56) References Cited

U.S. PATENT DOCUMENTS 8,669,785 B2 3/2014 Pickett
9,053,428 B2 6/2015 Hunzinger
(Continued)

FOREIGN PATENT DOCUMENTS

CN 106815636 A 6/2017
CN 108536422 A 9/2018
(Continued)

OTHER PUBLICATIONS

Kim, K. et al., "A Functional Hybrid Memristor Crossbar-Array/CMOS System for Data Storage and Neuromorphic Applications", Nano Lett. 12, pp. 389-395 (2012).
(Continued)

*Primary Examiner* — J. H. Hur
(74) *Attorney, Agent, or Firm* — Ladas & Parry, LLP (57) ABSTRACT

A circuit for performing energy-efficient and high-throughput multiply-accumulate (MAC) arithmetic dot-product operations and convolution computations includes a two dimensional crossbar array comprising a plurality of row inputs and at least one column having a plurality of column circuits, wherein each column circuit is coupled to a respective row input. Each respective column circuit includes an excitatory memristor neuron circuit having an input coupled to a respective row input, a first synapse circuit coupled to an output of the excitatory memristor neuron circuit, the first synapse circuit having a first output, an inhibitory memristor neuron circuit having an input coupled to the respective row input, and a second synapse circuit coupled to an output of the inhibitory memristor neuron circuit, the second synapse circuit having a second output. An output memristor neuron circuit is coupled to the first output and second output of each column circuit and has an output.

17 Claims, 8 Drawing Sheets

(51) Int. Cl.
   *G06F 7/544*  (2006.01)
   *G06F 17/15* (2006.01)
   *G11C 11/34* (2006.01)
   *G11C 11/54* (2006.01)
   *G11C 13/00* (2006.01)
   *H10B 63/00* (2023.01)

(52) U.S. Cl.
   CPC ............. *G11C 11/34* (2013.01); *G11C 11/54* (2013.01); *G11C 13/0002* (2013.01); *H10B 63/80* (2023.02)

(56) References Cited

U.S. PATENT DOCUMENTS

| | | | |
|---|---|---|---|
| 10,297,751 B2 | 5/2019 | Yi | |
| 10,541,274 B2 | 1/2020 | Yi | |
| 10,600,961 B2 | 3/2020 | Yi | |
| 2011/0004579 A1* | 1/2011 | Snider | G06N 3/049 706/26 |
| 2014/0214738 A1* | 7/2014 | Pickett | G11C 11/54 706/27 |
| 2014/0344201 A1 | 11/2014 | Arthur | |
| 2018/0018559 A1* | 1/2018 | Yakopcic | G11C 13/004 |
| 2018/0075339 A1 | 3/2018 | Ma et al. | |
| 2018/0075344 A1 | 3/2018 | Ma | |
| 2018/0212145 A1 | 7/2018 | Yi et al. | |
| 2018/0226453 A1 | 8/2018 | Yi | |
| 2019/0036023 A1 | 1/2019 | Yi et al. | |
| 2019/0095787 A1 | 3/2019 | Kung et al. | |
| 2020/0342301 A1* | 10/2020 | Miao | G06N 3/0454 |
| 2020/0356847 A1 | 11/2020 | Yi | |

FOREIGN PATENT DOCUMENTS

| | | |
|---|---|---|
| CN | 109460817 A | 3/2019 |
| CN | 109460818 A | 3/2019 |
| KR | 10-2015-0091186 A | 8/2015 |

OTHER PUBLICATIONS

Shafiee, A., et al. "ISAAC: A convolutional neural network accelerator with in-situ analog arithmetic in crossbars," In Proceedings of the International Symposium on Computer Architecture, Seoul, Korea, Jun. 18-22, 2016; pp. 14-26.

Yi, W. et al., "Biological plausibility and stochasticity in scalable $VO_2$ active memristor neurons," Nature Communications 9, pp. 1-10 (2018).

Li et al. "Analogue signal and image processing with large memristor crossbars," *Nature Electronics*, 1(1), p. 52. (2018).

Pickett et al. "A scalable neuristor built with Mott memristors" Nature Mater. 12, 114 (2013).

Yoon et al. "Truly electroforming-Free and Low-Energy Memristors with Preconditioned Conductive Tunneling Paths." Advanced Functional Materials 27 pp. 1-9 (2017).

PCT International Preliminary Report on Patentability (Chapter II) from PCT/US2020/021561 dated Jan. 8, 2021.

PCT International Search Report and Written Opinion from PCT/US2020/021561 dated Jul. 2, 2020.

Chen, Fan, et al., "EMAT: An Efficient Multi-Task Architecture for Transfer Learning using ReRAM," In: 2018 IEEE/ACM International Conference on Computer-Aided Design (ICCAD), Nov. 8, 2018.

Chen, Fan, et al., "ReGAN: A Pipelined ReRAM-Based Accelerator for Generative Adversarial Networks," In: 2018 23rd Asia and South Pacific Design Automation Conference (ASP-DAC), Jan. 25, 2018.

Song, Linghao, et al., PipeLayer: A Pipelined ReRAM-Based Accelerator for Deep Learning, In: 2017 IEEE International Symposium on High Performance Computer Architecture (HPCA), Feb. 8, 2017.

Office action from Chinese Patent Application No. 202080032752.X dated Apr. 26, 2022 with search report and its machine English translation.

Krestinskaya, et al., "Neuro-memristive Circuits for Edge Computing: A Review", IEEE, Nov. 28, 2018, pp. 1-19.

Mostafa et al., "A learning framework for winner-take-all networks with stochastic synapses", Institute of Neural Computation, Feb. 5, 2018, pp. 1-29.

Yakopcic et al., "Memristor Crossbar Deep Network Implementation Based on a Convolutional Neural Network", Department of Electrical and Computer Engineering, IEEE, 2016, pp. 963-970.

Lin et al., "Synaptic Strength For Convolutional Neural Network", $32^{nd}$ Conference on Neural Information Processing System (NeurIPS 2018), 2018, pp. 1-10.

International Search Report from PCT/US2020/021530, dated Aug. 11, 2020.

Written Opinion from the International Searching Authority from PCT/US2020/021530, dated Aug. 11, 2020.

International Preliminary Report on Patentability from PCT/US2020/021530, dated Mar. 24, 2021.

Extended Supplementary Search Report from European Patent Application No. 20801139.5 dated Nov. 16, 2022.

Liu, Chenchen, et al.: "A spiking neuromorphic design with resistive crossbar", Proceedings of the 34th ACM Sigmod-Sigact-Sigai Symposium on Principles of Database Systems, ACMPUB27, New York, NY, USA, Jun. 7, 2015, pp. 1-6, XP058511270, DOI: 10.1145/2744769.2744783, ISBN: 978-1-4503-3550-8.

U.S. Appl. No. 15/976,687, filed May 10, 2018 (non-publication request file), inventor Wei Yi.

U.S. Appl. No. 62/860,915, filed Jun. 13, 2019 (unpublished), inventor Wei Yi.

Partial Supplementary Search Report from European Patent Application No. 20801140.3 dated Mar. 27, 2023.

Geoffrey W. Burr et al.: "Neuromorphic computing using non-volatile memory", Advances in Physics: X, vol. 2, No. 1, Dec. 4, 2016, pp. 89-124, XP055405584.

Gopalakrishnan Srinivasan et al.: "STDP-based Unsupervised Feature Learning Using Convolution-over-time in Spiking Neural Networks for Energy-Efficient Neuromorphic Computing", ACM Journal on Emerging Technologies in Computing Systems (JETC), ACM, 2 Penn Plaza, Suite 701 New York NY 10121-0701 USA, vol. 14, No. 4, Nov. 27, 2018, pp. 1-12, XP058422041.

\* cited by examiner

| Metrics | Simulated | Metrics | Simulated |
|---|---|---|---|
| Typ. neuron spike rate | ~100 MHz | Energy per spike per neuron | 0.4 pJ |
| Typ. synapse resistance | 588 kΩ – 2 MΩ | Energy for a (5x5) convolution (in one output pixel) | 156 pJ |
| Typ. spike amplitude | ~1 V | Convolutions per input pixel | 10 |
| Typ. spike duration | ~2 ns | Energy per input pixel | 1.56 nJ |
| Input synapses per neuron | 50 | Bits per pixel | 3 |
| Spikes for convolution per output pixel | ~40 | Energy per input bit | 0.52 nJ |
| Energy per spike per synapse | ~0.01 pJ | Convolution throughput | 7.5 Mb/s |

FIG. 6

BIPOLAR ALL-MEMRISTOR CIRCUIT FOR IN-MEMORY COMPUTING

CROSS REFERENCE TO RELATED APPLICATIONS

This application is related to and claims priority from U.S. Provisional Application Ser. No. 62/844,611, filed May 7, 2019, and U.S. Provisional Application 62/860,915, filed Jun. 13, 2019 (632128), which are hereby incorporated by reference. This application is related to Non-Provisional Application (NP 632152 in prep), which is incorporated by reference herein as though set forth in full.

STATEMENT REGARDING FEDERAL FUNDING

This invention was made under U.S. Government contract FA8650-18-C-7869. The U.S. Government has certain rights in this invention.

TECHNICAL FIELD

This disclosure relates to neural networks.

BACKGROUND

Deep convolutional neural networks (CNNs) are the prevailing architecture for current machine learning and visual data processing. In typical CNNs, massive multiply-accumulate (MAC) arithmetic operations are used to compute the convolutions of input image patches for feature extraction. The convolutions are the most computationally intensive part of the CNN for visual or audio data processing. In conventional digital computers based on a von Neumann architecture, arithmetic logic units (ALUs) and data memory are spatially separated, and the energy used to move the data can be ten times higher than the energy used for computations. It is therefore desirable to develop novel circuit architectures that allow energy-efficient and high-throughput in-memory or near-memory computations.

A circuit architecture that can be beneficial for in-memory computing is a neuromorphic spiking neural network (SNN) that combines three major benefits.

First, a nonvolatile crossbar memory architecture that allows one of the two operands in MAC operations to be locally saved and reused, that greatly reduces the energy used in moving the data. Second, analog (continuous) switching of passive memristor synapses with moderate bit precision (up to ~7 bits for single element per synapse) that enables energy-savvy analog computing. And, third, a spike domain data representation that allows energy efficient MAC operations with minimal current draw.

However, prior art neuromorphic SNN demonstrations have been built mainly with CMOS electronics. CMOS electronics are not biomimetic and hence large circuit overheads are needed to construct neuron and synapse building blocks, negating the benefits of a SNN architecture.

Reference [1] U.S. Provisional Application 62/860,915, filed Jun. 13, 2019 (632128) (NP 632152 in prep), which is incorporated herein by reference, by the present inventors describes transistorless all-memristor SNN circuits and methods for energy-efficient and parallel in-memory MAC operations and convolution computations. The analog all-memristor neuromorphic convolution circuits (neurosynaptic processors) consist of excitatory active memristor based spiking neurons and passive memristor synapses. Synapse elements representing convolutional weights are organized into two-dimensional crossbar arrays with spiking memristor neurons connecting the rows (word lines) and columns (bit lines) at the edges. In-memory vector-matrix multiplication (VMM) arithmetic operations, can be computed in parallel using Ohm's law and Kirchhoff's current law principles to achieve high-throughput multi-kernel convolutions. The spike domain data coding warrants much better energy efficiency than digital circuits. Convolutional performance in image classification was analyzed by device-level SPICE simulations, which showed that the transistorless convolution circuits can deliver 10 times or better energy efficiency (0.3 nJ per input bit vs. 6.7 nJ per input bit) than state-of-the-art (SOA) CMOS neuromorphic processor (IBM TrueNorth).

However, the transistorless all-memristor neuromorphic circuits for in-memory computing using neurons and synapses of Reference [1] can only perform convolutions with kernels in which all weights are positive. This makes the circuit not suitable for some applications such as the implementation of convolutional layers in some neural network image classifiers.

The circuit described in Reference [2], which is incorporated herein by reference, describes analogue signal and image processing with memristor toolbar synapses, but it does not show the use of integrated memristor neurons. Also the circuit of Reference [2] may require external neurons, which would result in larger circuits that consume more power.

REFERENCES

The following references are incorporated herein as though set forth in full.

[1] U.S. Provisional Application 62/860,915, filed Jun. 13, 2019 (632128) (NP 632152 in prep)

[2] Li, C., Hu, M., Li, Y., Jiang, H., Ge, N., Montgomery, E., Zhang, J., Song, W., Dávila, N., Graves, C. E. and Li, Z., 2018. Analogue signal and image processing with large memristor crossbars. Nature Electronics, 1(1), p. 52.

[3] U.S. patent application Ser. No. 15/976,687, filed May 10, 2018.

[4] U.S. patent application Ser. No. 15/417,049, filed Jan. 26, 2017.

[5] U.S. patent application Ser. No. 16/005,529, filed Jun. 11, 2018.

[6] U.S. patent application Ser. No. 15/879,363 filed Jan. 24, 2018.

[7] M. D. Pickett, G. Medeiros-Ribeiro and R. S. Williams, A scalable neuristor built with Mott memristors. Nature Mater. 12, 114 (2013).

[8] M. D. Pickett, Logic circuits using Neuristors. U.S. Pat. No. 8,669,785 B2 (2014).

[9] Yoon, J. H., Zhang, J., Ren, X., Wang, Z., Wu, H., Li, Z., Barnell, M., Wu, Q., Lauhon, L. J., Xia, Q., and Yang, J. J., "Truly electroforming-free and low-energy memristors with preconditioned conductive tunneling paths." Advanced Functional Materials 27, pp. 1702010 (2017).

What is needed is a circuit that can efficiently perform convolutions with kernels in which the weights can have positive or negative values, and allows the implementation of convolutional layers for neural network image classifiers and which has low power. The embodiments of the present disclosure answer these and other needs.

SUMMARY

In a first embodiment disclosed herein, a circuit for performing energy-efficient and high-throughput multiply-accumulate (MAC) arithmetic dot-product operations and convolution computations comprises a two dimensional crossbar array comprising a plurality of row inputs and at least one column having a plurality of column circuits, wherein each column circuit is coupled to a respective row input, wherein each respective column circuit comprises an excitatory memristor neuron circuit having an input coupled to a respective row input, a first synapse circuit coupled to an output of the excitatory memristor neuron circuit, the first synapse circuit having a first output, an inhibitory memristor neuron circuit having an input coupled to the respective row input, and a second synapse circuit coupled to an output of the inhibitory memristor neuron circuit, the second synapse circuit having a second output, and an output memristor neuron circuit coupled to the first output and second output of each column circuit, the output memristor neuron circuit having an output.

In another embodiment disclosed herein, a method for setting conductance values for excitatory memristor synapse circuits and inhibitory memristor synapse circuits comprises training convolutional kernel weights using a prevailing stochastic gradient descent method, and converting a trained convolutional kernel weight element $w(i,j)$ of a $k^{th}$ convolutional kernel, wherein i and j are the row and column indices of a two dimensional weight matrix into dual-quadrant synaptic conductance values that can be either positive or negative by converting the trained convolutional kernel weight element $w(i,j)$ to a synapse weight $g(i,j)$ using a linear conversion scheme so that $g(i,j)=(w(i,j)\times 1.2e^{-6})/\max(w(i,j))$, determining whether $g(i,j)$ is positive or negative, and if the synapse weight $g(i,j)$ is zero or positive, then setting a conductance $g_{inh}(i,j)$ of a respective inhibitory memristor synapse circuit to a first lower bound value, and setting a conductance $g_{exc}(i,j)$ of a respective excitatory memristor synapse circuit to a value such that a total conductance $g(i,j)$ or a signed summation of $g_{inh}(i,j)$ and $g_{exc}(i,j)$) equals $w(i,j)\times 1.2e^{-6}/\max(w(i,j))$, if the synapse weight $g(i,j)$ is negative, then setting a conductance $g_{exc}(i,j)$ of a respective excitatory memristor synapse circuit to a second lower bound value, and setting a conductance $g_{inh}(i,j)$ of a respective inhibitatory memristor synapse circuit to a value such that a total conductance $g(i,j)$ or a signed summation of $g_{inh}(i,j)$ and $g_{exc}(i,j)$) equals $w(i,j)\times 1.2e^{-6}/\max(i,j)$.

In yet another embodiment disclosed herein, a method for performing energy-efficient and high-throughput multiply-accumulate (MAC) arithmetic dot-product operations and convolution computations comprises providing a two dimensional crossbar array comprising a plurality of row inputs and at least one column having a plurality of column circuits, wherein each column circuit is coupled to a respective row input, wherein each respective column circuit comprises an excitatory memristor neuron circuit having an input coupled to a respective row input, a first synapse circuit coupled to an output of the excitatory memristor neuron circuit, the first synapse circuit having a first output, an inhibitory memristor neuron circuit having an input coupled to the respective row input, and a second synapse circuit coupled to an output of the inhibitory memristor neuron circuit, the second synapse circuit having a second output, and providing an output memristor neuron circuit coupled to the first output and second output of each column circuit, the output memristor neuron circuit having an output.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

In the present disclosure a transistorless memristive neuromorphic electronic circuit and a method for energy-efficient and high-throughput multiply-accumulate (MAC) arithmetic operations and convolution computations are described. Compared with the circuits described in Reference [1] in which the values of the scaling element (synaptic weight) can only be positive, the present invention utilizes excitatory and inhibitory memristor neurons and synapses to enable both positive and negative synaptic weights. Bi-polarity (or "dual-quadrant") synaptic weights helps to improve both the training convergence and the inference accuracy for convolutional neural network (CNN) based image classification applications.

Reference [1] describes the basic operating principles (based on Ohm's law and Kirchhoff's current law) for an all-memristor in-memory vector-matrix multiplication (VMM) arithmetic operations. The present invention applies the same operating principles; however, the circuit of the present invention allows both positive and negative synaptic weights.

The present disclosure describes transistorless memristive neuromorphic electronic circuits and methods for energy-efficient and high-throughput multiply-accumulate (MAC) arithmetic operations, which are sometimes called dot product operations, Vector-Matrix Multiplication (VMM) operations, and convolution computations.

The analog all-memristor neuromorphic convolution circuits (neurosynaptic processors) consist of active memristor based excitatory and inhibitory spiking neurons and passive memristor synapses. Synapse elements representing positive and negative convolutional weights may be organized into a two-dimensional crossbar array with both spiking memristor excitatory neurons and spiking memristor inhibitory neurons. In-memory vector-matrix multiplication (VMM) arithmetic operations, can be computed in parallel using Ohm's law and Kirchhoff's current law principles to achieve high-throughput multi-kernel convolutions. The spike domain data coding has much better energy efficiency than a digital circuit implementation. Convolutional performance in visual data processing (image classification) has been analyzed by device-level SPICE simulations, and shows that the presented transistorless convolution circuits can deliver 10 times or better energy efficiency than state-of-the-art (SOA) CMOS neuromorphic processor.

Embodiments of this disclosure utilize active and passive memristor devices and circuits described for example in Reference [3] U.S. patent application Ser. No. 15/976,687, Reference [5] U.S. patent application Ser. No. 16/005,529, and Reference [6] U.S. patent application Ser. No. 15/879,363, which are incorporated herein by reference.

Figure 1A:
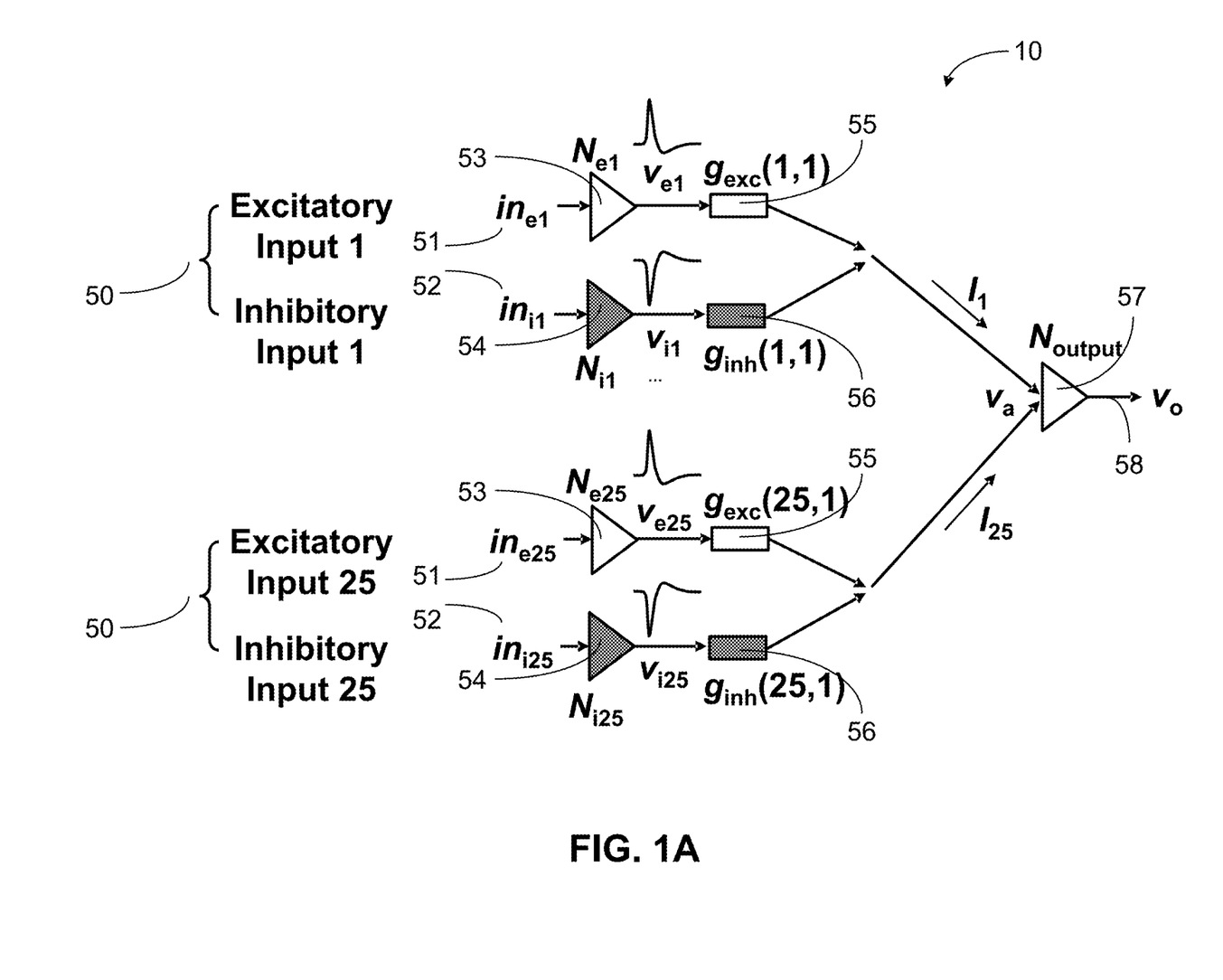
FIG. 1A shows a symbolic diagram of a bi-polarity ("dual-quadrant") all-memristor convolutional kernel with 25 excitatory input neurons, 25 inhibitory input neurons and one excitatory output neuron.

FIG. 1A shows a circuit architecture of a bi-polarity ("dual-quadrant") all-memristor convolutional circuit 10, which provides symmetric 'dual-quadrant' convolutional kernel weights. It is similar to the 'single-quadrant' memristor convolutional circuit described in Reference [1], but includes an additional set of inhibitory input neurons 54 and synapses 56, as shown in FIG. 1A, which are not present the 'single-quadrant' memristor convolutional circuit described in Reference [1].

FIG. 1A shows an example bi-polarity all-memristor convolutional kernel 10 containing 25 excitatory memristor neuron circuits 53, 25 inhibitory memristor neuron circuits 54 and one excitatory output memristor neuron circuit 57. The additional inhibitory neuron circuits 54, which are connected to synapse circuits 56, allow symmetric MAC operations, in which the synaptic weights can be either positive or negative. In contrast, the circuits described in Reference [1] perform asymmetric MAC operations with only positive synaptic weights.

As shown in FIG. 1A, the output of each respective excitatory memristor neuron circuit 53 is an input to a connected respective synapse circuit 55, and the output of each respective inhibitory memristor neuron circuit 54 is an input to a connected respective synapse circuit 56. The output of each synapse circuit 55 and 56 is an input to the excitatory output memristor neuron 57. The output 58 of the bi-polarity all-memristor convolutional kernel 10 is the convolution of the inputs 50 (for the example shown in FIG. 1A there are 25 inputs 50) with the effective weights provided by the excitatory memristor neuron circuits 53 connected to synapse circuits 55, and the effective weights provided by the inhibitory memristor neuron circuits 54 connected to synapse circuits 56. Each respective input 50 is connected to a respective input 51 to an excitatory memristor neuron circuit 53 and to a respective input 52 to an inhibitory memristor neuron circuit 54.

The effective weights of the excitatory memristor neuron circuits 53 and the connected synapse circuits 55 may be zero or positive. The effective weights of the inhibitory memristor neuron circuits 54 and the connected synapse circuits 56 may be zero or negative, but can be configured to be only negative.

Figure 1B:
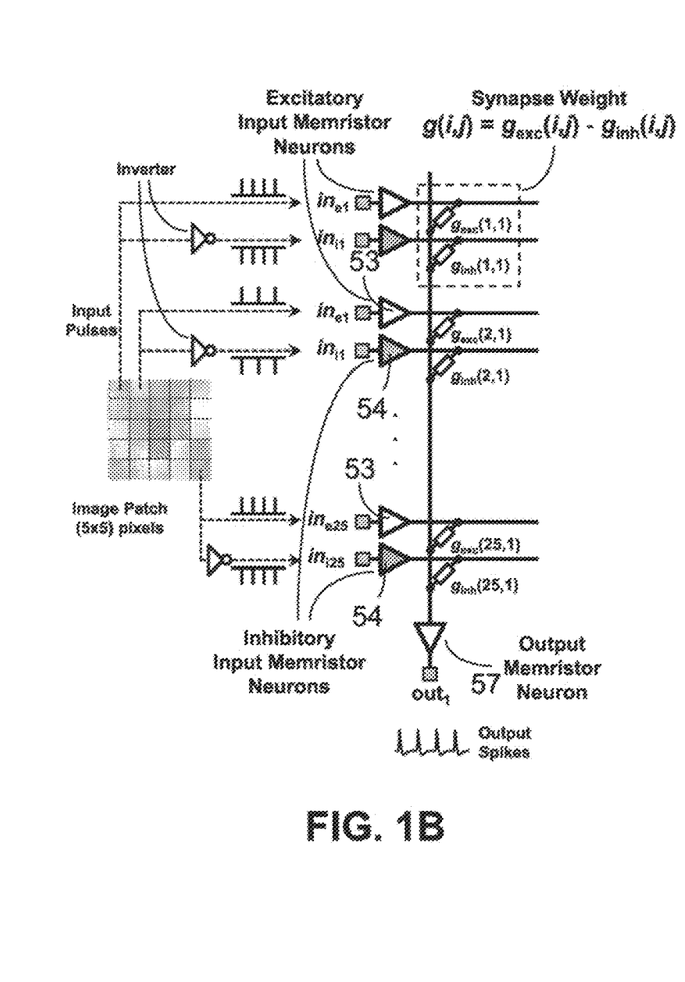
FIG. 1B shows a diagram of a bi-polarity all-memristor convolutional circuit and FIG. 1C shows a diagram of a bi-polarity all-memristor convolutional circuit having 10 convolutional kernels as shown in FIG. 1A operating in parallel.

FIG. 1B shows a simplified diagram of a bi-polarity all-memristor convolutional circuit in accordance with FIG. 1A, where the inputs to the excitatory memristor neuron circuits 53 and to the inhibitory memristor neuron circuits 54 are from an image patch 100.

Figure 1C:
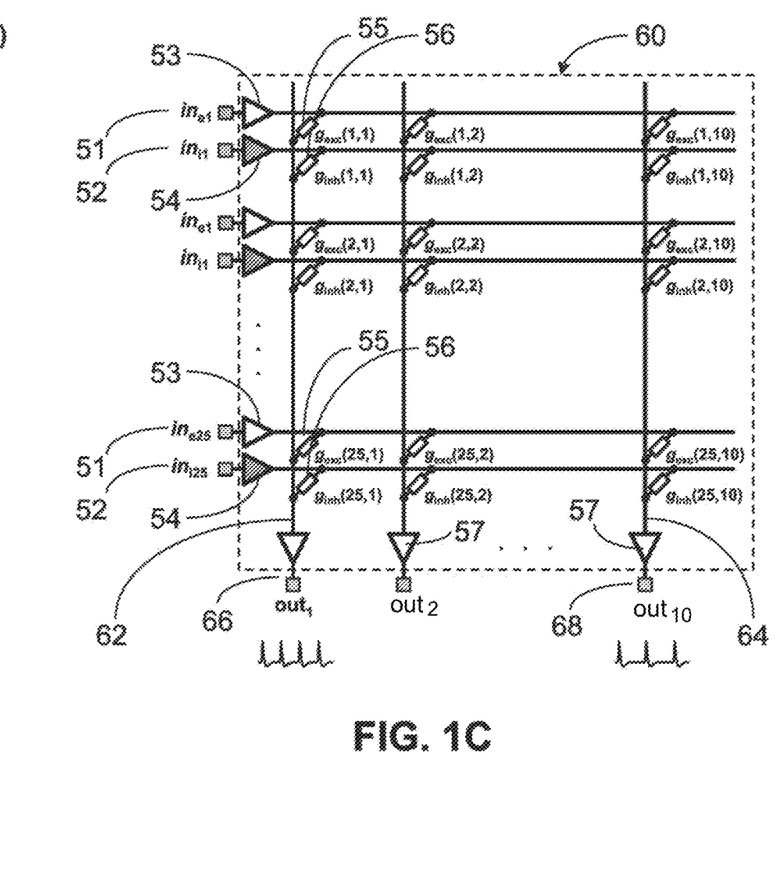

FIG. 1C shows a simplified physical diagram of a bi-polarity all-memristor convolutional circuit 60, similar to FIG. 1B, but which includes ten (10) convolutional kernels operating in parallel. For example, $out_1$ 66 is the convolution of the 25 inputs 50 in1 to $in_{25}$ connected to the rows of the two dimensional matrix with the effective weights of the excitatory memristor neuron circuits 53 connected to synapse circuits 55 and the effective weights of the inhibitory memristor neuron circuits 54 and connected synapse circuits 56 in the first column 62 of the matrix, as shown in FIG. 1C. The $out_{10}$ 68 is the convolution of the 25 inputs 50 in1 to $in_{25}$ connected to the rows of the two dimensional matrix with the effective weights of the excitatory memristor neuron circuits 53 connected to synapse circuits 55 and the effective weights of the inhibitory memristor neuron circuits 54 and connected synapse circuits 56 in column 64 of the matrix, as shown in FIG. 1C.

Figure 1D:
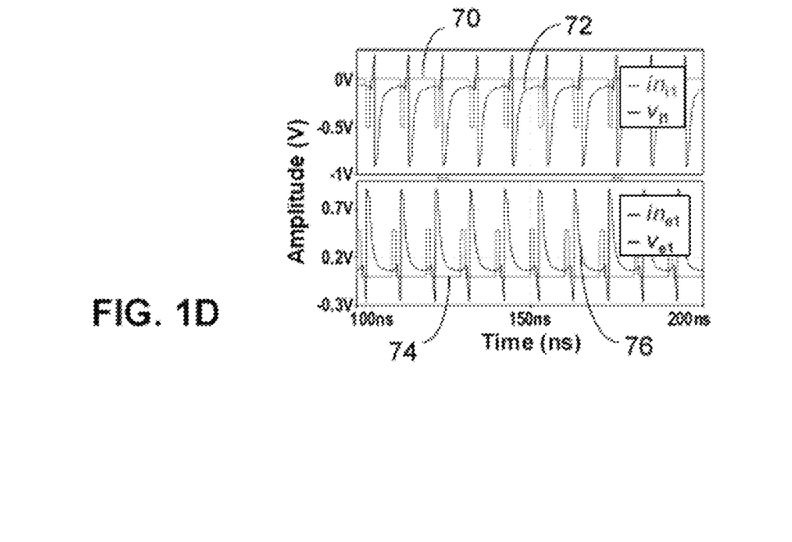
FIG. 1D shows simulated spike waveforms at input and output of one inhibitory memristor neuron and one excitatory memristor neuron.
Figure 1E:
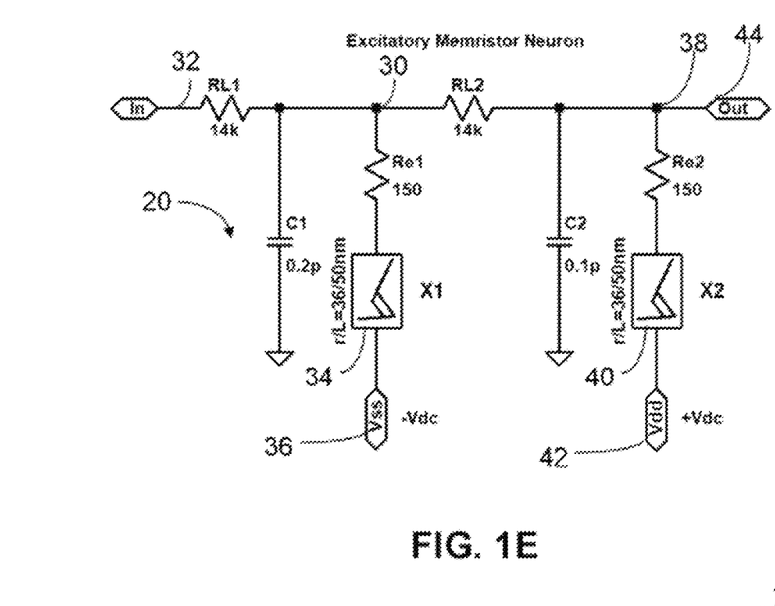
FIG. 1E shows a circuit schematic of an excitatory memristor neuron.
Figure 1F:
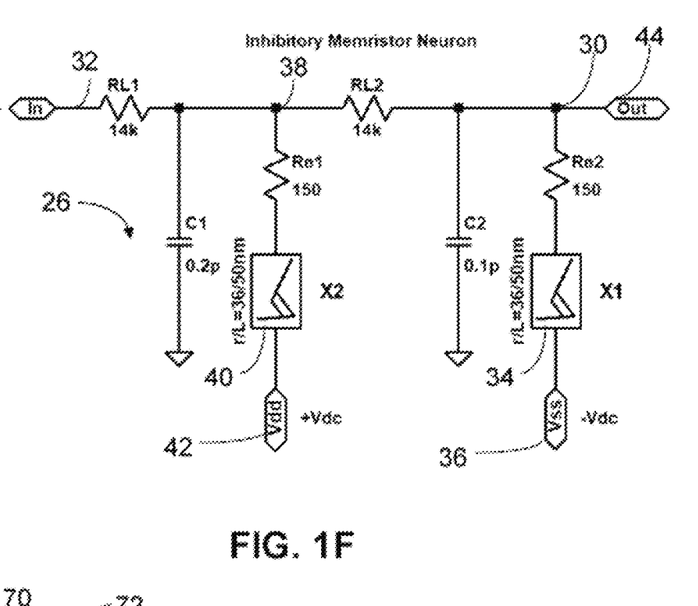
FIG. 1F shows a circuit schematic of an inhibitory memristor neuron in accordance with the present disclosure.

FIG. 1E shows a circuit schematic of an excitatory memristor neuron, and FIG. 1F shows a circuit schematic of an inhibitory memristor neuron.

In FIGS. 1E and 1F, X1 and X2 represent vanadium oxide ($VO_2$) active memristor devices, and Re1 and Re2 are the parasitic series resistance (150Ω) from the electrode wires to the $VO_2$ active memristor devices. The label In is the input port of the neuron, and the label Out is the output port of the neuron. Vdd is a positive supply voltage, and Vss is a negative supply voltage.

The SPICE model parameters for X1 and X2 are: deltaT=43, rch=56e-9, Lchan=100e-9, rhoIns=1e-2, rhoMet=3e-6, kappa=3.5, cp=3.3e6, deltahtr=2.35e8. More details of the excitatory and inhibitory $VO_2$ memristor neuron operations are described in Reference [7] U.S. patent application Ser. No. 15/976,687, filed May 10, 2018, which is incorporated herein by reference.

FIG. 1E shows a schematic of an excitatory memristor neuron circuit 20, which has first (X1) and second (X2) negative differential resistance (NDR) devices that are biased with opposite polarities (−Vdc; +Vdc). The first and second NDR devices (X1, X2) are coupled to first and second grounded capacitors (C1, C2), respectively.

The first NDR device (X1) has a first node 30 connected to an input node 32 of the neuron circuit 20 by a first load resistor RL1 and a second node 34 connected to a first voltage source 36; the first node (30) of the first NDR device (X1) is coupled to the first grounded capacitor (C1). The second NDR device (X2) has a first node 38 connected to the first node 30 of the first NDR device X1 by a second load resistor RL2 and a second node 40 connected to a second voltage source 42; the first node 38 of the second NDR device X2 is coupled to the second grounded capacitor C2; the first node 38 of the second NDR device X2 forming an output node 44 of the neuron circuit 20.

The first voltage source 36 is a negative voltage source and the second voltage source 42 is a positive voltage source. The voltages −Vdc, +Vdc provided by voltages sources 36 and 42 can have the same amplitude or they can have different amplitudes. The d.c. voltage supplies 36 and 42 are amplitude-matched only if the two NDR devices X1 and X2 are well matched in their switching threshold voltages. If the switching threshold voltages of X1 and X2 are different, then the values of their d.c. voltage supplies have to be chosen differently, so that both NDR devices are biased at the proper operating points (less than, but close to their switching threshold voltage) for the neuron circuit to spike properly.

The first and second NDR devices X1, X2 can each comprise, between their first (respectively 30, 38) and second (respectively 36, 40) nodes, a resistance (respectively Re1, Re2) in series with an NDR material. The NDR material of the first and second NDR devices X1, X2 can be a layer or thin film of vanadium dioxide. Re1 can have a value of a few hundred Ohms and can be the cumulative resistance of a first metal nanowire electrode arranged between the first node (30) and a first side of the NDR material of X1, and of a second metal nanowire electrode arranged between second node (34) and a second side of the NDR material of X1. Similarly, Re2 can have a value of a few hundred Ohms and can be the cumulative resistance of a first metal nanowire electrode arranged between the first node (38) and a first side of the NDR material of X2, and of a second metal nanowire electrode arranged between second node (40) and a second side of the NDR material of X2.

A vanadium dioxide layer can be generated by electroforming from a vanadium pentoxide layer, as detailed in U.S. patent application Ser. No. 15/417,049, (filed Jan. 26, 2017, Reference [8], above) which is incorporated by reference to this presentation.

Alternatively, the vanadium dioxide layer can be directly prepared by a variety of thin film deposition methods, including but not limited to, reactive d.c. or r.f. magnetron sputtering of vanadium metal or vanadium oxide targets, atomic layer deposition followed by post-deposition anneal, or metallic precursor oxidation.

The first and second voltage sources (36, 42) are arranged to bring the first and second NDR devices (X1, X2) close to their respective Mott Insulator-to-Metal Transition; and the voltage biases can be adjusted to set desired levels of voltage or current threshold for the neuron action potential generation (spike firing) and desired signal gains. The first load resistor, the first NDR device, the first voltage source and the first grounded capacitor are arranged to form a first relaxation oscillator; and the second load resistor, the second NDR device, the second voltage source and the second grounded capacitor are arranged to form a second relaxation oscillator.

The NDR material of the first and second NDR devices X1, X2 can be a layer or thin film of vanadium dioxide, where vanadium dioxide has an Mott insulator-to-metal (IMT) transition temperature TC of 340 K (67° C.). The operation of such vanadium dioxide NDR devices only requires a very moderate Joule heating to raise the local temperature by 40 K (or ° C.) above room temperature. For example, it has been calculated that a NDR device having a vanadium dioxide channel with a 10-nm radius (located for example in a thin film of vanadium pentoxide), has an extremely low estimated switching energy of 1.2 fJ, which is 50 times lower than a NbO2 device, such as disclosed by Pickett et al. in References [7] and [8], which are incorporated herein by reference. It is expected that vanadium dioxide based neurons circuits according to embodiments of this presentation are capable of achieving a biologically-competitive 0.1 pJ/spike or less neuron energy use. A single $VO_2$ NDR device can operate as low as 1.2 fJ, but the energy consumption of the complete neuron circuit (X1, X2, C1, C2, RL1, RL2) is dominated by the charging energy of the two capacitors. The 0.1 pJ/spike total energy consumption is estimated assuming exemplary d.c. bias level near 0.5 V and with 40-50 fF capacitors (such a small capacitor value is chosen for neuron size and spike frequency considerations).

The neuron circuit 20 can be used in a neural circuit having a plurality of neuron circuits connected in a network, for example, as shown in FIG. 1A; input node 32 being arranged to receive an input waveform through an input impedance Zin; and output node 44 being arranged to provide an output waveform through an output impedance Zout.

FIG. 1F shows a schematic of an inhibitory memristor neuron circuit 26, which has first (X2) and second (X1) NDR devices that are biased with opposite polarities (+Vdc; −Vdc). The first and second NDR devices (X2, X1) are coupled to first and second grounded capacitors (C2, C1), respectively.

The first NDR device (X2) has a first node 38 connected to an input node 32 of the neuron circuit 26 by a first load resistor RL1 and a second node 40 connected to a first voltage source 42. The first node 38 of the first NDR device X2 is coupled to the first grounded capacitor C2. The second NDR device (X1) has a first node 30 connected to the first node 38 of the first NDR device X2 by a second load resistor RL2 and a second node 34 connected to a second voltage source 36. The first node 30 of the second NDR device X1 is coupled to the second grounded capacitor C21. The first node 30 of the second NDR device X1 is an output node 44 of the neuron circuit 26.

The first voltage source 42 of neuron circuit 26 is a positive voltage source and the second voltage source 36 is a negative voltage source. The voltages −Vdc, +Vdc provided by voltages sources 36 and 42 can have a same amplitude or they can have different amplitudes, as discussed above.

The first and second NDR devices X2, X1 can each comprise, between their first (respectively 38, 30) and second (respectively 40, 34) nodes, a resistance (respectively Re1, Re2) in series with an NDR material. The NDR material of the first and second NDR devices X2, X1 can be a layer or thin film of vanadium dioxide, for example identical to the one detailed previously for neuron circuit 20.

Re1 can have a value of a few hundred Ohms and can be the cumulative resistance of a first metal nanowire electrode arranged between the first node (38) and a first side of the NDR material of X2, and of a second metal nanowire electrode arranged between second node (40) and a second side of the NDR material of X2. Similarly, Re2 can have a value of a few hundred Ohms and can be the cumulative resistance of a first metal nanowire electrode arranged between the first node (30) and a first side of the NDR material of X1, and of a second metal nanowire electrode arranged between second node (34) and a second side of the NDR material of X1.

The vanadium dioxide layer can be generated by electroforming from a vanadium pentoxide layer, as detailed in U.S. patent application Ser. No. 15/417,049, (filed Jan. 26, 2017, Reference [8], above) which is incorporated by reference to this presentation.

Alternatively, the vanadium dioxide layer can be directly prepared by a variety of thin film deposition methods, including but not limited to, reactive d.c. or r.f. magnetron sputtering of vanadium metal or vanadium oxide targets, atomic layer deposition followed by post-deposition anneal, or metallic precursor oxidation.

The first and second voltage sources (42, 36) are arranged to bring the first and second NDR devices (X2, X1) close to their respective Mott Insulator-to-Metal Transition; and the voltage biases can be adjusted to set desired levels of voltage or current threshold for the neuron action potential generation (spike firing) and desired signal gains. The first load resistor, the first NDR device, the first voltage source and the first grounded capacitor are arranged to form a first relaxation oscillator; and the second load resistor, the second NDR device, the second voltage source and the second grounded capacitor are arranged to form a second relaxation oscillator.

One or more of neuron circuits 20 and 26 can be used in a neural circuit having a plurality of neuron circuits connected in a network, such as for example, FIG. 1A, and also, for example, as illustrated in FIG. 1B (of Reference [7] U.S. patent application Ser. No. 15/976,687, filed May 10, 2018).

A Mott IMT physics-based SPICE model of VO2 NDR devices was used to simulate the excitatory and inhibitory neuron circuits as shown in FIGS. 1E and 1F, respectively. In the SPICE model, the VO2 conduction channel is modeled as a cylindrical volume with a radius of 28-56 nm and a length of 50-100 nm. These dimensions are close to experimentally observed values in electroformed VO2 NDR devices (see U.S. patent application Ser. No. 15/417,049, filed Jan. 26, 2017, Reference [8], above) or electroform-free $VO_2$ NDR devices.

It is noted that the excitatory and inhibitory neuron circuits 20, 26 of FIGS. 1E and 1F are both tonic neuron circuits. According to embodiments of this presentation, and as detailed hereafter, tonic neuron circuits 20 and 26 can be made phasic by replacing the input load resistor (RL1 in 20 or RL2 in 26) by a capacitor or a capacitor in series with a resistor.

Each excitatory memristor neuron circuit 53, as shown in FIG. 1A may be implemented with the excitatory neuron circuit of FIG. 1E, and each inhibitory memristor neuron circuit 54 may be implemented with the inhibitory neuron circuit of FIG. 1F. The excitatory output memristor neuron 57 may also be implemented with the excitatory neuron circuit of FIG. 1E.

The synapse circuits 55 and 56 may be passive memristor synapse circuits. An example of a passive memristor is described in Reference [9] Yoon, J. H., Zhang, J., Ren, X., Wang, Z., Wu, H., Li, Z., Barnell, M., Wu, Q., Lauhon, L. J., Xia, Q., and Yang, J. J., "Truly electroforming-free and low-energy memristors with preconditioned conductive tunneling paths." Advanced Functional Materials 27, pp. 1702010 (2017), which is incorporated herein by reference.

In the present disclosure, each passive memristor synapse circuit may be a 2 terminal resistor whose resistance value is a positive value.

FIG. 1D shows typical simulated spike waveforms at the input 70 and the output 72 of an inhibitory memristor neuron circuit 54. FIG. 1D also shows typical simulated spike waveforms at the input 74 and the output 76 of an excitatory memristor neuron circuit 53. A notable feature is that an excitatory memristor neuron circuit 53 does not fire if the input 74 is subthreshold or below threshold, such as a negative input, and an inhibitory memristor neuron circuit 54 does not fire if the input 70 is suprathreshold or above the threshold, such as a zero or positive input.

To evaluate and benchmark the in-memory computing performance of the bi-polarity all-memristor convolutional circuit as shown in FIG. 1C, a customized convolutional neural network (CNN) image classification model was used employing the MATLAB neural network toolbox for classification of the MNIST image set. The convolutional kernel (filter) weights were trained in the CNN model using the prevailing stochastic gradient descent method. Then the pre-trained convolutional kernel weights were converted into dual-quadrant synaptic conductance values that can be either positive or negative.

Figure 2:
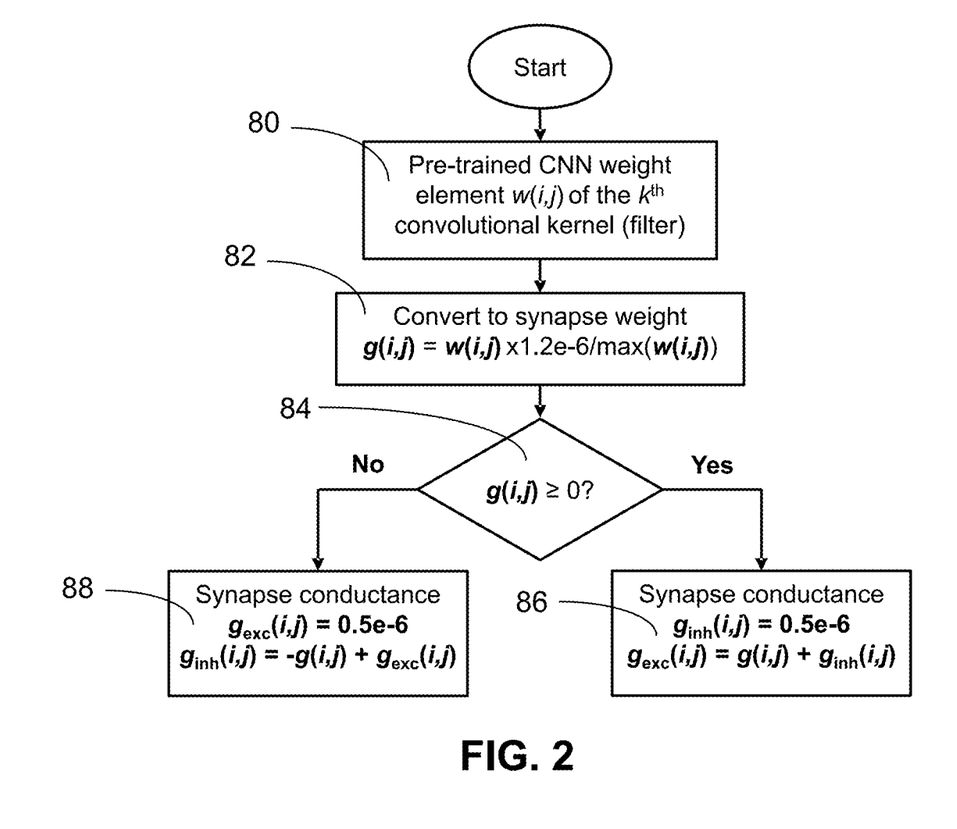
FIG. 2 shows a block diagram showing the algorithm for setting the conductance values for the excitatory synapse element $g_{exc}(i,j)$ and inhibitory synapse element $g_{inh}(i,j)$ based on the sign of the synapse weight $g(i,j)$ converted from a pre-trained CNN convolutional kernel weight $w(i,j)$ in accordance with the present disclosure.

The conversion algorithm is shown in FIG. 2 and described below.

1. In step 80 from the pre-trained CNN weight element w(i,j) of the $k^{th}$ convolutional kernel (i and j are the row and column indices of the 2D weight matrix).

2. In step 82 convert the pre-trained CNN weight element w(i,j) to the synapse weight g(i,j) using a linear conversion scheme so that g(i,j)=(w(i,j)×1.2e$^{-6}$)/max(w(i,j)).

3. In step 84 determine whether g(i,j) is positive or negative.

4. In step 86, if the synapse weight g(i,j) is zero or positive, then the conductance $g_{inh}$(i,j) of the inhibitory synapse is set to the lower bound value (for example, the lower bound value may be a resistance of 2 MΩ), and the conductance $g_{exc}$(i,j) of the excitatory synapse is set to a value such that the total conductance g(i,j) (signed summation of $g_{inh}$(i,j) and $g_{exc}$(i,j)) equals to the synapse weight in step 82.

5. In step 88, if the synapse weight g(i,j) is negative, then the conductance $g_{exc}$(i,j) of the excitatory synapse is set to set to the lower bound value (for example, the lower bound may be a resistance of 2 MΩ), and the conductance $g_{inh}$(i,j) of the inhibitory synapse is set to a value such that the total conductance g(i,j) (signed summation of $g_{inh}$(i,j) and $g_{exc}$(i, j)) equals to the synapse weight in step 82.

Figure 3A:
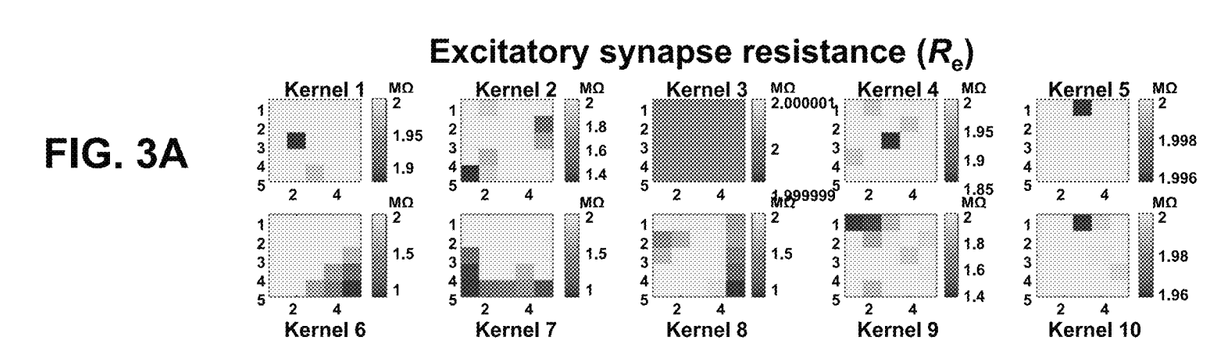
FIG. 3A shows calculated resistance values for the 250 excitatory memristor synapses.
Figure 3B:
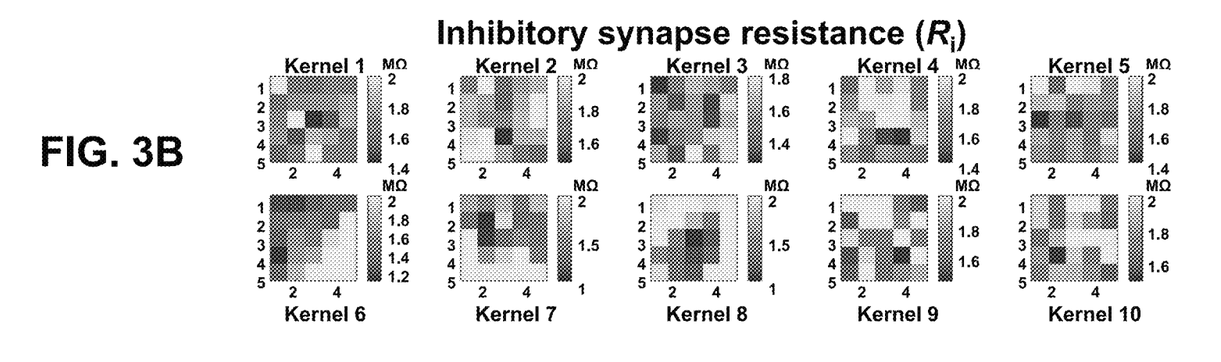
FIG. 3B shows the calculated resistance values for the 250 inhibitory memristor synapses of the bi-polarity all-memristor convolutional circuit of FIG. 1B, using the algorithm shown in FIG. 2, in accordance with the present disclosure.

FIGS. 3A and 3B show an example set of calculated resistance values for the 250 excitatory memristor synapses and 250 inhibitory memristor synapses of the bi-polarity all-memristor convolutional circuit of FIG. 1C, converted using the algorithm in FIG. 2 from pre-trained convolutional kernel weights of a customized MATLAB CNN model. The same rate-based data encoding scheme and benchmarking method was used as described in Reference [1] for evaluating the bi-polarity all-memristor convolution circuit and method.

Figure 4:
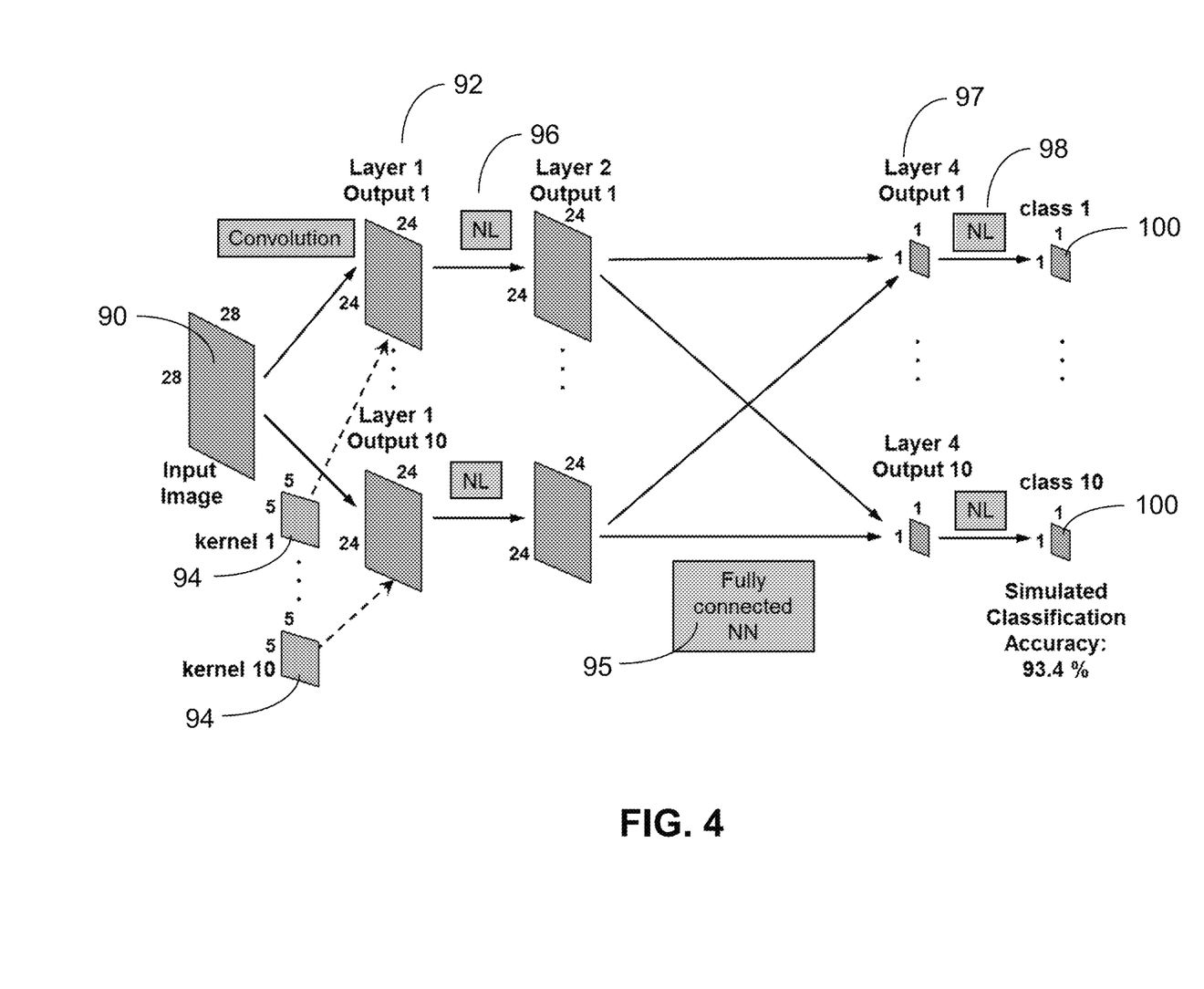
FIG. 4 shows a customized MATLAB CNN model used to benchmark the energy efficiency and throughput metrics of the bi-polarity all-memristor convolution circuit shown in FIG. 1B in accordance with the present disclosure.

FIG. 4 shows the customized MATLAB CNN image classification model used for benchmarking. It is designed to classify 28×28 pixel grayscale (256 levels) MNIST handwritten digit input images 60. The MNIST image set 90 has a total of 10,000 images and has a total of 10 image classes 100 (for digits 0 to 9). This simplified CNN model includes one convolutional layer 92 having 10 (5×5) convolutional kernels (filters) for feature extraction, two nonlinear ("NL") layers 96 and 98, and one fully-connected neural network (NN) layer 95, whose output is layer 4, reference number 97. The first nonlinear layer 96 after convolution is based on a rectified linear unit (ReLU) transformation. The fully connected layer 95 performs multiplications and sums. The final nonlinear layer 98 performs a winner take all (WTA) operation, wherein only one output class with the highest output value among the ten outputs is selected as the final output class. For simplicity, no batch normalization layer or pooling layer (originally Layer 3) was used. Neglecting these layers did not deteriorate the image classification accuracy (a 93.4% accuracy was achieved after training). In simulated benchmarking, the convolutional layer 92 was implemented by an all-memristor convolution circuit, as shown in FIG. 1B, and was simulated by a SPICE simulator (Cadence Verilog AMS). The simulated convolutional layer activations (outputs) in spike domain were converted back and loaded to the rest of the MATLAB CNN model to complete the image classification process using MATLAB numerical calculations.

The number of multiply and accumulate (MAC) (or comparable) numerical operations required for MNIST image classification is 144,000 MACs for Layer 1 the convolution layer 92, 5,760 operations for Layer 2 the ReLU nonlinear layer 96, and 57,600 MACs for Layer 4 the fully connected layer 95. It is clear that the convolutional layer 92 is the most computationally intensive part of the CNN model. This is also the case for much more sophisticated deep CNN models used in the industry.

Figure 5:
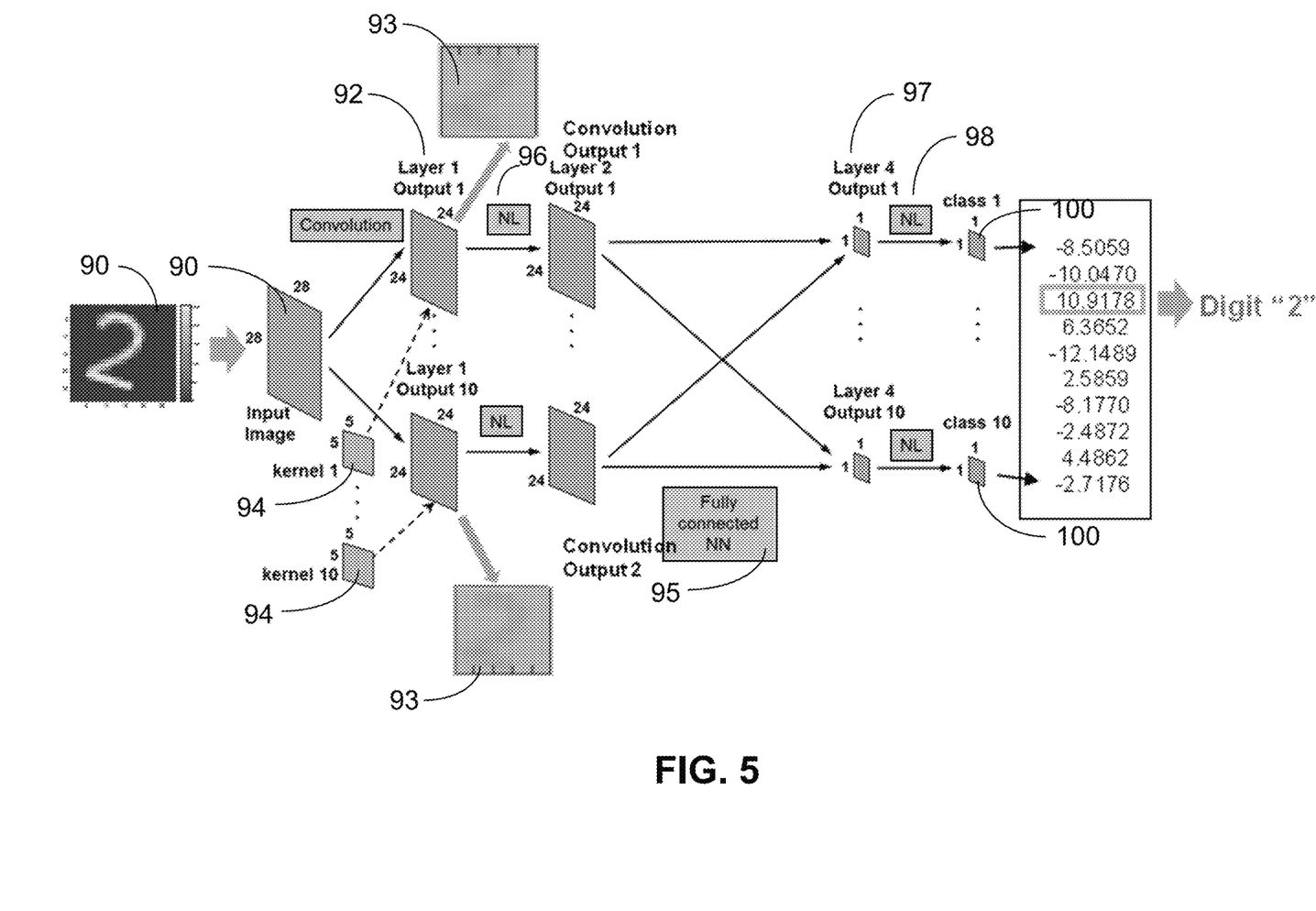
FIG. 5 shows an example of MNIST image classification benchmarked using the MATLAB CNN model in FIG. 4, wherein the convolutional layer operations are simulated with an all-memristor convolutional circuit, as shown in FIG. 1B in a SPICE simulator, showing that the class of the input image, in this case, a handwritten digit "2", is determined by the largest value in the ten classifier outputs in accordance with the present disclosure.

FIG. 5 shows an example benchmarking operation of the simplified (no pooling) MATLAB CNN model, as shown in FIG. 4, for image classification benchmarking. In this example, the input 90 is a 28×28 pixel MNIST image of a handwritten digit (digit "2"). The convolutional layer 92 having ten 5×5 bi-polarity convolutional kernels is simulated (in Cadence Verilog AMS) by a memristor neurosynaptic convolution circuit having 50×10 passive memristor synapses 55 and 56, as shown in FIG. 1B. The simulated memristor convolution outputs are ten 24×24 pixel output images 94, and two of them are shown in FIG. 5. The images 94 are then sent back to the MATLAB model to calculate the classification outputs. The nonlinear classifier layer Layer 4 98 has ten outputs, one for each digit class 100. The highest value (10.9178 in this case) in the ten outputs points to the correct class of digit "2".

Figure 6:
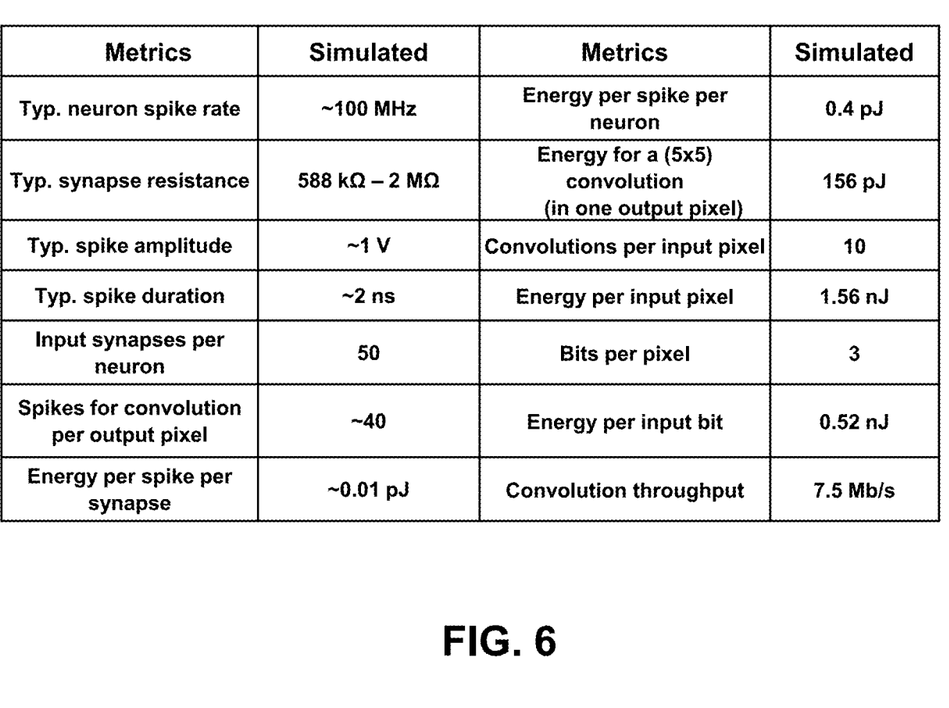
FIG. 6 shows a table of benchmarked MNIST image convolution performance metrics for an all-memristor bi-polarity convolution circuit containing a (50×10) passive memristor synapse crossbar array in accordance with the present disclosure.

FIG. 6 shows a table, which is a summary of the benchmarking analysis. The simulated all-memristor convolution energy efficiency per input bit is 0.52 nJ/b, translating into an overall image classification energy efficiency per input bit of 0.61 nJ/b, which is better than 10× improvement over the prior art CMOS neuromorphic processor (the IBM TrueNorth, at 6.7 nJ/b).

The simulated memristor convolution throughput for a (50×10) passive memristor crossbar array shown in FIG. 1B for bi-polarity (dual-quadrant) convolution is about 7.5 Mb/s. As a comparison, the prior art CMOS neuromorphic processor has an image classification throughput of 30.7 Mb/s. This indicates that the circuit of the present invention can rival the throughput of the prior art using merely four copies of such (50×10) memristor crossbar arrays, with a total synapse count of only 4×50×10=2000. The prior art TrueNorth chip uses 4042 out of the 4096 neurosynaptic cores in its benchmarking. Each TrueNorth neurosynaptic core contains (256×256)=65536 synapses, bringing the total amount of synapses in-use to ~265 million. This indicates a synapse count ratio of $1.32 \times 10^5$ for achieving similar throughput for TrueNorth vs. using the circuits of the present invention. Such a large contrast in the required synapse count can be explained by the large difference in the operating spike rates, which have a rate of about 100 MHz for the present invention vs. a rate of only about 200 Hz for the prior art TrueNorth).

Note that the Si prior art (TrueNorth) uses a more sophisticated CNN model for image classification benchmarking, which involves more convolutional layers and multiply and accumulate (MAC) operations. Therefore it is helpful to compare the architecture-independent energy use, or Joule per operation (J/OP). However, this number is not available for TrueNorth. In the present invention, the simulated all-memristor energy use per MAC operation is ~6 pJ/OP. This value is based on counting ~40 spikes for rate-based convolution per output pixel. This is a rather conservative practice to ensure spike rate accuracy. In the best-case scenario of counting ~4 spikes for convolution per output pixel, the all-memristor energy use per operation can reach ~0.6 pJ/OP. Thus making it possible to access the sub-pJ/OP regime for approximate computing applications. Note that this estimation is based on a 0.4 pJ/spike $VO_2$ neuron energy efficiency, which is not the lower bound of the technology.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A circuit for performing energy-efficient and high throughput multiply-accumulate (MAC) arithmetic dot-product operations and convolution computations comprising:
   a two-dimensional crossbar array comprising a plurality of row inputs and at least one column having a plurality of column circuits, wherein each column circuit is coupled to a respective row input;
   an excitatory memristor neuron circuit (53) having an input coupled to a respective row input;

an inhibitory memristor neuron circuit (54) having an input coupled to the respective row input inverted;
wherein each column circuit coupled to said respective row input comprises:
a first synapse circuit ($g_{exc}$) coupled to an output of the excitatory memristor neuron circuit (53) coupled to said respective row input, the first synapse circuit ($g_{exc}$) having a first output; and
a second synapse circuit ($g_{inh}$) coupled to an output of the inhibitory memristor neuron circuit (54) coupled to said respective row input, the second synapse circuit ($g_{inh}$) having a second output; and
an output excitatory memristor neuron circuit (57) being coupled to the first output and the second output of each column circuit, the output excitatory memristor neuron circuit (57) having an output; wherein
each memristor neuron circuit is provided for generating an output spike of constant amplitude and shape in response to any input signal sufficient for triggering the memristor neuron circuit.

2. The circuit of claim 1:
wherein each first synapse circuit and each second synapse circuit comprises a passive memristor synapse circuit.

3. The circuit of claim 1 wherein each respective excitatory memristor neuron circuit comprises:
a first negative differential resistance (NDR) device biased with a first voltage source;
a second negative differential resistance (NDR) device biased with a second voltage source, wherein the first voltage source and the second voltage source are opposite polarities;
a first capacitor coupled to ground and coupled to a first node of the first NDR device;
a first load resistor coupled between an input node of the excitatory active memristor neuron circuit or the self-excitatory active memristor output neuron circuit and the first capacitor;
a second capacitor coupled to ground; and
a second load resistor coupled between the first capacitor and the second capacitor, and coupled to a first node of the second NDR device;
wherein the first node of the second NDR device forms an output node of the excitatory memristor neuron circuit;
wherein the first voltage source is a negative voltage source; and
wherein the second voltage source is a positive voltage source.

4. The circuit of claim 3 further comprising:
a third load resistor coupled between the first capacitor and the first node of the first NDR device; and
a fourth load resistor coupled between the second capacitor and a first node of the second NDR device.

5. The circuit of claim 3 wherein:
at least one of the first and second NDR devices comprises a vanadium dioxide layer.

6. The circuit of claim 3 wherein:
the first and second voltage sources are configured to bring the first and second negative differential resistance (NDR) devices close to their respective Mott insulator-to-metal transition.

7. The circuit of claim 1 wherein each respective inhibitory memristor neuron circuit comprises:
a first negative differential resistance (NDR) device biased with a first voltage source;
a second negative differential resistance (NDR) device biased with a second voltage source, wherein the first voltage source and the second voltage source are opposite polarities;
a first capacitor coupled to ground and coupled to a first node of the first NDR device;
a first load resistor coupled between an input node of the inhibitory active memristor neuron circuit and the first capacitor;
a second capacitor coupled to ground; and
a second load resistor coupled between the first capacitor and the second capacitor, and coupled to a first node of the second NDR device;
wherein the first node of the second NDR device forms an output node of the inhibitory active memristor neuron circuit;
wherein the first voltage source is a positive voltage source; and
wherein the second voltage source is a negative voltage source.

8. The circuit of claim 7 further comprising:
a third load resistor coupled between the first capacitor and the first node of the first NDR device; and
a fourth load resistor coupled between the second capacitor and a first node of the second NDR device.

9. The circuit of claim 7 wherein:
at least one of the first and second NDR devices comprises a vanadium dioxide layer.

10. The circuit of claim 7 wherein:
the first and second voltage sources are configured to bring the first and second negative differential resistance (NDR) devices close to their respective Mott insulator-to-metal transition.

11. The circuit of claim 1:
wherein the two-dimensional crossbar array further comprises a plurality of columns, wherein each column has a plurality of column circuits and each column circuit in a respective column is coupled to a respective row input.

12. The circuit of claim 1:
wherein a respective excitatory memristor neuron circuit does not fire if the respective row input coupled to the respective excitatory memristor neuron circuit is below a threshold or has a negative value; and
wherein a respective inhibitory memristor neuron circuit does not fire if the respective row input coupled to the respective excitatory memristor neuron circuit is above a threshold or has a positive value.

13. A method for performing energy-efficient and high-throughput multiply-accumulate (MAC) arithmetic dot-product operations and convolution computations comprising:
providing a two dimensional crossbar array comprising a plurality of row inputs and at least one column having a plurality of column circuits, wherein each column circuit is coupled to a respective row input;
providing an excitatory memristor neuron circuit having an input coupled to a respective row input; providing an inhibitory memristor neuron circuit having an input coupled to the respective row input inverted;
wherein each column circuit coupled to said respective row input comprises:
a first synapse circuit coupled to an output of the excitatory memristor neuron circuit coupled to said respective row input, the first synapse circuit having a first output; and a second synapse circuit coupled to an output of the inhibitory memristor neuron circuit coupled to said respective row input, the second synapse circuit having a second output; and providing an output excitatory memristor neuron circuit coupled to the first output and the second output of each column circuit, the output excitatory memristor neuron circuit having an output; wherein each memristor neuron circuit is provided for generating an output spike of constant amplitude and shape in response to any input signal sufficient for triggering the memristor neuron circuit.

14. The method of claim 13 wherein each respective excitatory memristor neuron circuit comprises:
a first negative differential resistance (NDR) device biased with a first voltage source;
a second negative differential resistance (NDR) device biased with a second voltage source, wherein the first voltage source and the second voltage source are opposite polarities;
a first capacitor coupled to ground and coupled to a first node of the first NDR device;
a first load resistor coupled between an input node of the excitatory active memristor neuron circuit or the self-excitatory active memristor output neuron circuit and the first capacitor;
a second capacitor coupled to ground; and
a second load resistor coupled between the first capacitor and the second capacitor, and coupled to a first node of the second NDR device;
wherein the first node of the second NDR device forms an output node of the excitatory memristor neuron circuit;
wherein the first voltage source is a negative voltage source; and
wherein the second voltage source is a positive voltage source.

15. The method of claim 13 wherein each respective inhibitory memristor neuron circuit comprises:
a first negative differential resistance (NDR) device biased with a first voltage source;
a second negative differential resistance (NDR) device biased with a second voltage source, wherein the first voltage source and the second voltage source are opposite polarities;
a first capacitor coupled to ground and coupled to a first node of the first NDR device;
a first load resistor coupled between an input node of the inhibitory active memristor neuron circuit and the first capacitor;
a second capacitor coupled to ground; and
a second load resistor coupled between the first capacitor and the second capacitor, and coupled to a first node of the second NDR device;
wherein the first node of the second NDR device forms an output node of the inhibitory active memristor neuron circuit;
wherein the first voltage source is a positive voltage source; and
wherein the second voltage source is a negative voltage source.

16. The method of claim 13:
wherein the two-dimensional crossbar array further comprises a plurality of columns, wherein each column has a plurality of column circuits and each column circuit in a respective column is coupled to a respective row input.

17. The method of claim 13:
wherein a respective excitatory memristor neuron circuit does not fire if the respective row input coupled to the respective excitatory memristor neuron circuit is below a threshold or has a negative value; and
wherein a respective inhibitory memristor neuron circuit does not fire if the respective row input coupled to the respective excitatory memristor neuron circuit is above a threshold or has a positive value.

* * * * *